United States Patent [19]
Tsuji

[11] Patent Number: 5,676,554
[45] Date of Patent: Oct. 14, 1997

[54] BOARD MOUNTED CONNECTOR

[75] Inventor: Takeshi Tsuji, Yokkaichi, Japan

[73] Assignee: Sumitomo Wiring Systems, Ltd., Mie, Japan

[21] Appl. No.: 620,179

[22] Filed: Mar. 22, 1996

[30] Foreign Application Priority Data

Mar. 28, 1995 [JP] Japan ................................. 7-096020
May 17, 1995 [JP] Japan ................................. 7-143909

[51] Int. Cl.$^6$ ................................................. H01R 9/09
[52] U.S. Cl. ........................................................ 439/79
[58] Field of Search ...................................... 439/79, 80

[56] References Cited

U.S. PATENT DOCUMENTS

| | | | |
|---|---|---|---|
| 4,857,017 | 8/1989 | Erk | 439/79 |
| 4,986,772 | 1/1991 | Fukutani | 439/79 |
| 5,433,624 | 7/1995 | Tabata | 439/79 |
| 5,453,016 | 9/1995 | Clark et al. | 439/80 |
| 5,468,154 | 11/1995 | Yip et al. | 439/79 |

FOREIGN PATENT DOCUMENTS

A-63-231891  9/1988  Japan.

*Primary Examiner*—Khiem Nguyen
*Assistant Examiner*—Yong Ki Kim
*Attorney, Agent, or Firm*—Oliff & Berridge

[57] ABSTRACT

An alignment plate rotatably connected with a lower face of a housing via a hinge portion is provided with a plurality of board terminal through-holes. Guide ribs are formed at openings of the through-holes to introduce ends of board terminals into the through-holes. When the alignment plate is rotated backwards into the alignment position, all board terminals are guided into the through-holes by the guide ribs, and the alignment plate is locked to the housing. Also, a terminal alignment member having a plurality of board terminal through-holes is rotatably connected to a connector housing and the board terminals are aligned when they penetrate the terminal through-holes. The terminal alignment member is composed of four division elements, which are integrally connected with each other via hinge portions. To make the terminals penetrate the terminal through-holes, each division element is rotated around the hinge portion such that the terminals are interposed between the division elements with tapering protrusions aligning with and being pushed into V-shaped cutout portions.

20 Claims, 8 Drawing Sheets

BOARD MOUNTED CONNECTOR

BACKGROUND OF THE INVENTION

The invention relates to a connector mounted on a printed circuit board by inserting a group of terminals onto the printed circuit board, and more particularly relates to a connector to be mounted on a board having an alignment plate to align board terminals that protrude from the back of the connector and are bent toward a bottom side of the connector so that the board terminals can be corrected to the proper positions.

Conventionally, this type of connector comprises a plurality of pin-shaped terminals that protrude from the back of a box-shaped connector housing and are bent at right angles so that they are directed downward. The terminals are inserted into a large number of land holes formed on a printed circuit board and fixed by means of soldering. The connector housing is fixed to the printer circuit board by screws when necessary.

However, when making connection, it is necessary to substantially simultaneously insert a large number of terminals into the small land holes on the printed circuit board. Accordingly, if the alignment of the group of terminals is even partially disordered, it takes additional time to insert the terminals into the land holes. Further, the terminals of the connector are formed from slender metallic rods or sheets which tend to bend. Furthermore, they protrude from the connector housing, and the length of the protruding portions is long. Therefore, the group of terminals come into contact with other objects when the connector is moved about or conveyed. As result, they are often deformed and the alignment of terminals disordered.

In view of the above circumstances, conventionally, a terminal alignment plate is provided for guiding a group of terminals into an aligned position, with the terminal alignment plate being attached to the connector housing. An example of the above technique is shown in FIGS. 16 and 17 which is disclosed in Japanese Unexamined Patent Publication 63-231891.

Figure 16:
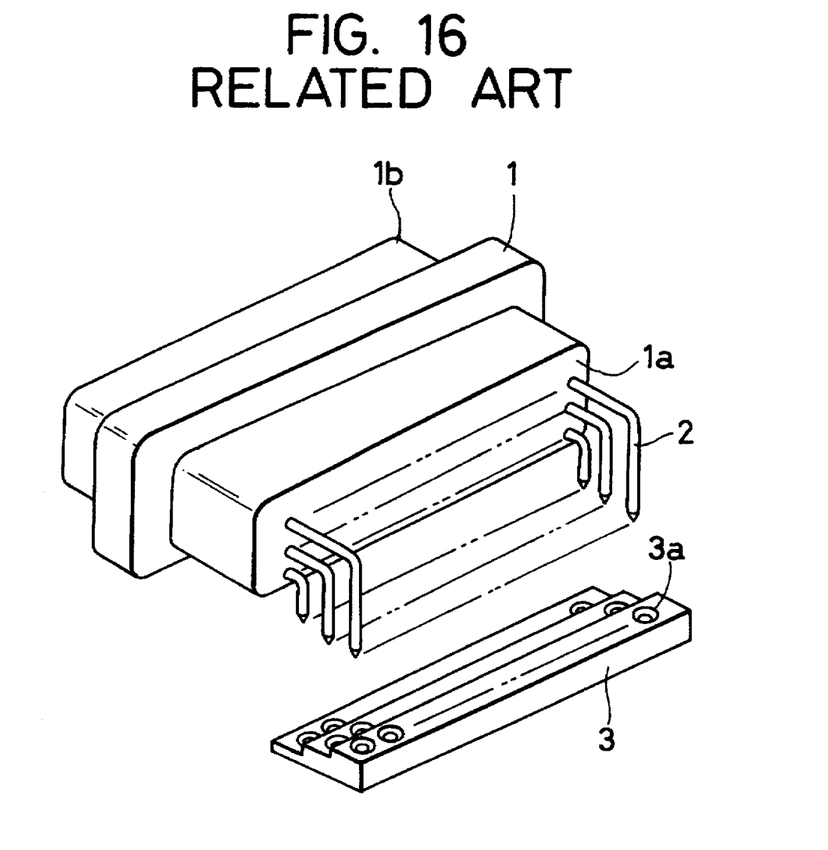
FIG. 16 is a perspective view of the conventional connector to be mounted on a board.
Figure 17:
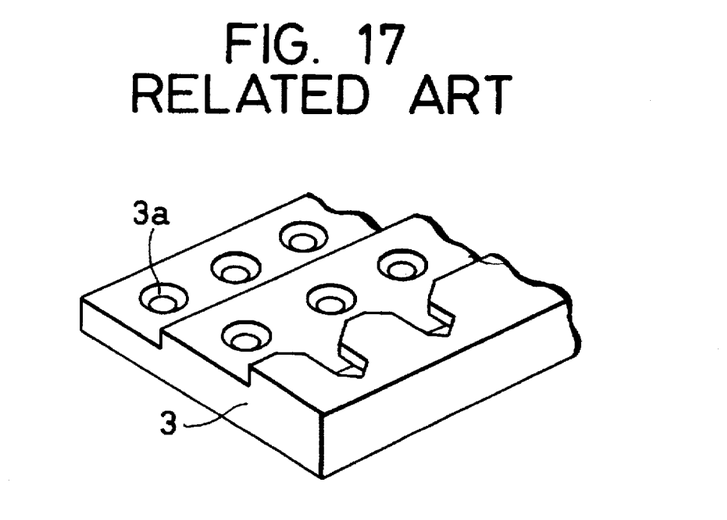
FIG. 17 is a partially enlarged perspective view of the conventional connector to be mounted on a board.

In FIGS. 16 and 17, a housing 1 is provided that is formed in a hood-shape so that it can be connected with an opponent connector. The housing 1 is attached to a printed board while an opening of the housing 1 is directed in the horizontal direction. In a hood portion 1b, a plurality of board terminals 2 are provided which function as male side terminal fittings. The plurality of board terminals 2 penetrate through and protrude from a back wall face 1a of the housing 1. After the board terminals 2 have penetrated through the back wall face 1a and protrude in the horizontal direction, end portions of the board terminals 2 are perpendicularly bent downward toward the bottom face side of the housing. Lengths of the board terminals 2 are approximately the same so that the end portions of the board terminals 2 penetrate through and slightly protrude from the printed board. On the alignment plate 3, through-holes 3a are formed corresponding to the normal positions of the board terminals 2, and openings of the through-holes 3a are tapered so that the ends of the board terminals 2 can be easily inserted into the openings.

In the conventional connector to be mounted on a board, openings of the through-holes 3a are tapered, however, in the process of the mounting operation, it is necessary to position both the alignment plate 3 itself and the board terminals 2. Accordingly, the work is complicated.

SUMMARY OF THE INVENTION

The invention has been accomplished in view of the above problems. An object of the invention is to provide a connector to be mounted on a board onto which the alignment plate can be easily mounted.

To accomplish the above object, the first embodiment of the invention provides a connector to be mounted on a board comprising a housing having a plurality of board terminals that protrude from the back wall of the housing and are bent toward the bottom face side, and an alignment plate having through-holes formed at normal positions of the plurality of board terminals. The alignment plate is attached to a bottom face of the housing via a hinge portion, and can be rotated around the hinge portion while a rear end of the alignment plate is directed to ends of the board terminals. Guide ribs are provided at the through-holes formed on the alignment plate such that a circumferential surface of each guide rib on the side opposite to the hinge portion spreads out in a fan-shape.

Further, the invention provides a connector to be mounted on a board comprising a housing having a plurality of terminal fittings to be connected with an opponent connector and also having board terminals for communicating with the terminal fittings that protrude from the back of the housing and are bent toward the bottom face side of the housing. An alignment plate is connected to the bottom face of the housing via a hinge portion. The alignment plate includes through-holes formed at positions corresponding to normal positions of the plurality of board terminals when the alignment plate is rotated to the rear end side of the housing to a final, aligning position. Guide ribs are provided at the through-holes such that a circumferential surface of each guide rib on the side opposite to the hinge portion spreads out in a fan-shape.

Further, the alignment plate and the housing are provided with a protrusion and recess engaging mechanism which functions as a rotational fulcrum. The alignment plate and the housing are provided with a lock mechanism by which the alignment plate is fixed in a final, aligning position relative to the housing in which the alignment plate is substantially completely rotated backward. Moreover, the alignment plate has a conveyance lock mechanism by means of which the alignment plate is fixed relative to the housing such that fore ends of approximately all board terminals are located within a range of thickness of the alignment plate before the alignment plate reaches the final aligning position.

According to the first embodiment of the invention arranged as described above, an end of the alignment plate is attached to a bottom face of the housing, and the alignment plate can be rotated around the hinge portion. That is, while the hinge is used as a fulcrum, a rear end of the alignment plate can be rotated toward the end positions of the board terminals which protrude from the back of the housing. On the alignment plate, the through-holes are formed at positions corresponding to normal positions of the board terminals. However, since the alignment plate is rotated around the hinge portion, it moves through an arc. Therefore, ends of the board terminals are not necessarily opposed to the through-holes. However, guide ribs are formed at the through-holes such that the circumferential surfaces of the through-holes on the side opposite to the hinge portion protrude and spread out in a fan-shape. Accordingly, ends of the bent board terminals come into contact with the guide ribs and are guided into the through-holes.

Further, when the alignment plate is rotated with respect to the housing, they are rotatably engaged with each other via the protrusion and recess engaging mechanism, so that an accurate rotational fulcrum is formed. Consequently, the board terminals are effectively guided into the through-holes when the alignment plate is rotated.

Furthermore, the alignment plate is fixed relative to the housing by the lock mechanism in the final aligning position in which the alignment plate is approximately completely rotated backward.

Moreover, during gradual rotation of the alignment plate, ends of approximately all board terminals are positioned within a range of thickness of the alignment plate before the final aligning position is reached. The board terminals close to the hinge are in a position immediately after the board terminals penetrate the alignment plate, and the board terminals distant from the hinge are in a position immediately before board terminals penetrate the alignment plate. When the lock mechanism used for conveyance fixes the alignment plate relative to the housing in the above condition, ends of the board terminals are prevented from colliding with a foreign body, so that the board terminals are not damaged. Even when the board terminals close to the hinge slightly penetrate the alignment plate, only the ends of the board terminals protrude slightly from the alignment plate. Therefore, the ends of the board terminals are seldom damaged even if they collide with a foreign body.

According the second embodiment of the invention, a plurality of terminals protrude from one face of a connector housing, and a terminal alignment member has terminal through-holes through which the terminals penetrate. The terminal alignment member is rotatably attached to the connector housing and includes a plurality of division elements divided on lines connecting the terminal through-holes. The plurality of division elements butt to each other to form the terminal through-holes that the terminals penetrate, and the plurality of division elements are connected to each other by hinge portions.

Further, the terminal through-holes are formed between V-shaped cutout portions provided in one of the division elements that butt to each other and tapering protrusions provided in the other of the division elements when the tapering protrusions enter the V-shaped cutout portions.

Furthermore, according to a third embodiment of the invention, the connector housing may include a guide rib contactable with the terminal alignment member. The connector may comprise an engaging portion for engaging each division element.

According to the second embodiment of the invention, the terminal alignment member comprises a plurality of division elements divided on lines connecting the terminal through-holes. To make the terminals penetrate the terminal through-holes, the division elements are butted to each other such that the terminals are interposed between them. Therefore, it is not necessary to make the terminals penetrate small holes. Since the division elements are connected to each other by hinge portions, when they are combined with each other by folding at the hinge portions, the division elements are butted to each other in succession.

Further, the terminal through-holes are formed between the V-shaped cutout portions provided in one of the division elements that are butted to each other and the tapering ends provided in the other of the division elements. Therefore, the terminals are pushed into the V-shaped cutout portions by the tapering ends.

Furthermore, according to the third embodiment, when the division elements are butted to each other to form the terminal alignment member, the division members are guided by the guide ribs, and the division elements are engaged to each other by engaging portions.

DETAILED DESCRIPTION OF PREFERRED EMBODIMENTS

While the invention will hereinafter be described in connection with preferred embodiments thereof, it will be understood that it is not intended to limit the invention to those embodiments. On the contrary, it is intended to cover all alternatives, modifications, and equivalents that may be included within the spirit and scope of the invention as defined by the appended claims.

For a general understanding of the features of the invention, reference is made to the drawings. In the drawings, like reference numerals have been used throughout to designate identical elements and overlapping explanations are omitted.

Figure 1:
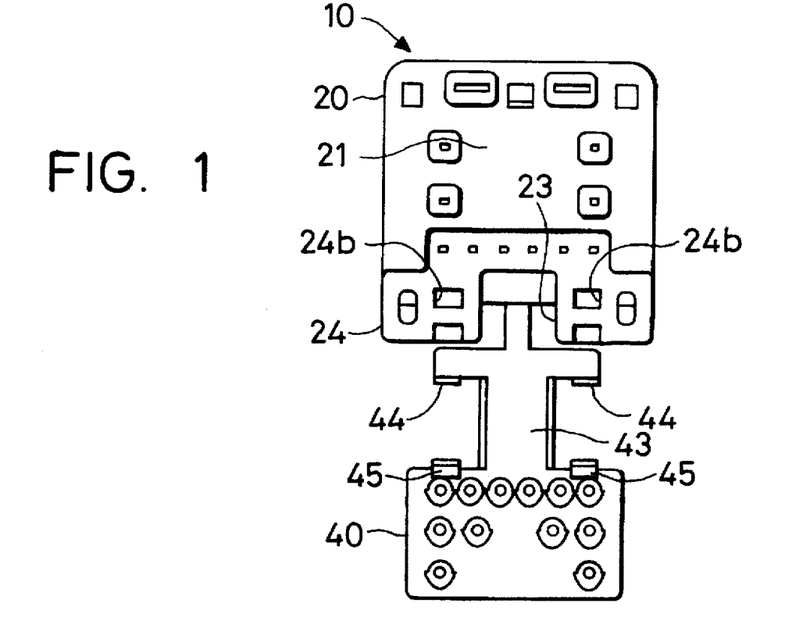
FIG. 1 is a back view of the connector to be mounted on a board according to the first embodiment of the invention.

Referring to FIG. 1, the first embodiment of the invention will be explained as follows.

Figure 2:
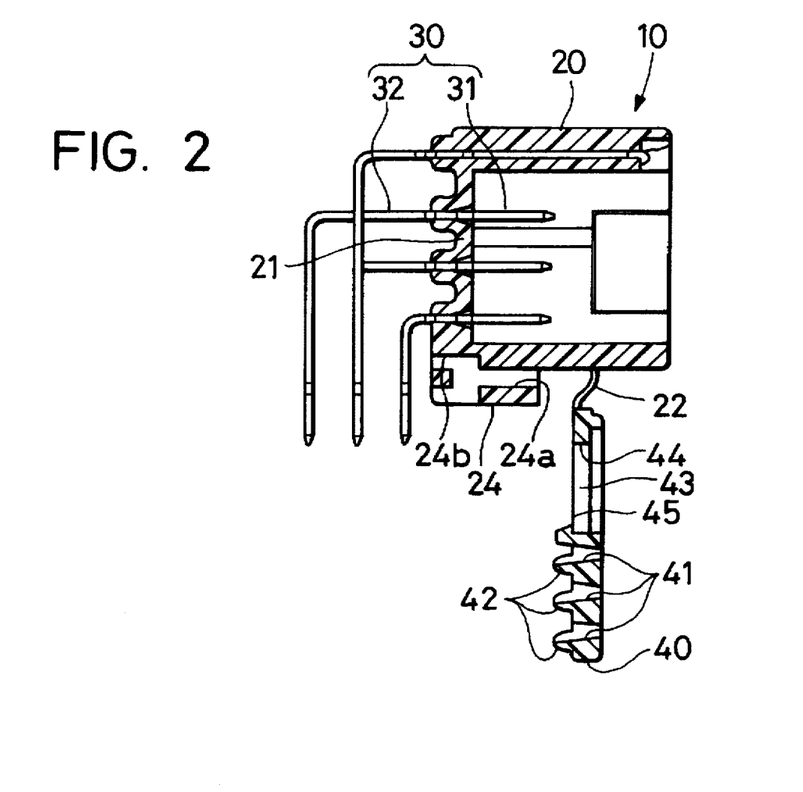
FIG. 2 is a cross-sectional view of the connector to be mounted on a board before assembly.

FIG. 1 is a back view of a connector to be mounted on a board according to the first embodiment of the invention. FIG. 2 is a view showing a side section of the connector.

The connector 10 to be mounted on a board is provided with a rectangular box-shaped housing 20, one face of which is open. It is possible to mount the connector 10 on a printed board not shown while the opening is directed in the horizontal direction. Male side terminal fittings 30 are press-fitted from the back into an inner wall 21 of the housing opposed to the opening. The male side terminal fittings 30 become male side terminals 31 inside the housing 30. Also, the male side terminal fittings 30 become board terminals 32 when they protrude from the back. The board terminals 32 protrude from the back of the housing approximately in the horizontal direction and are vertically bent downward and extend by predetermined lengths. There are 3 stages of lengths at which the board terminals 32 are bent. Some board terminals 32 are bent at a position close to the inner wall 21, and others are bent at a position distant from the inner wall 21.

The board terminals 32 become the male side terminals 31 inside the housing 20, however, the board terminals 32 protrude from the back of the housing 20 and are bent vertically at positions where the board terminals 32 extend by predetermined lengths. The lengths at which the board terminals 32 are bent are not limited to 3 stages, but other stages may be adopted. As long as the lengths are sufficient for the board terminals 32, any lengths may be adopted.

Figure 3:
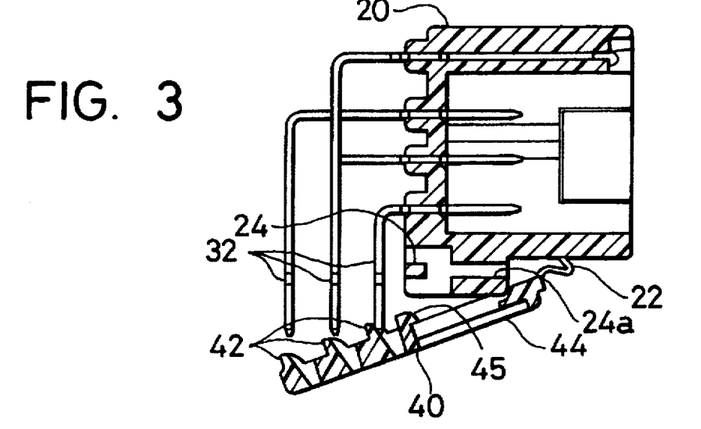
FIG. 3 is a cross-sectional view of the connector to be mounted on a board in the process of assembly.
Figure 4:
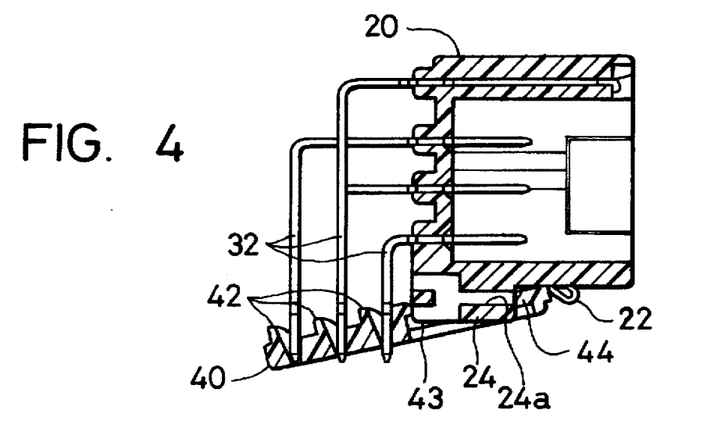
FIG. 4 is a cross-sectional view of the connector to be mounted on a board in the process of assembly.
Figure 5:
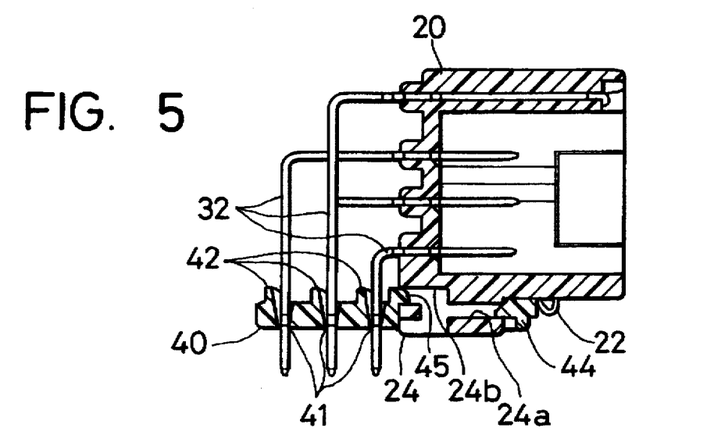
FIG. 5 is a cross-sectional view of the connector to be mounted on a board in the final aligning position.
Figure 6:
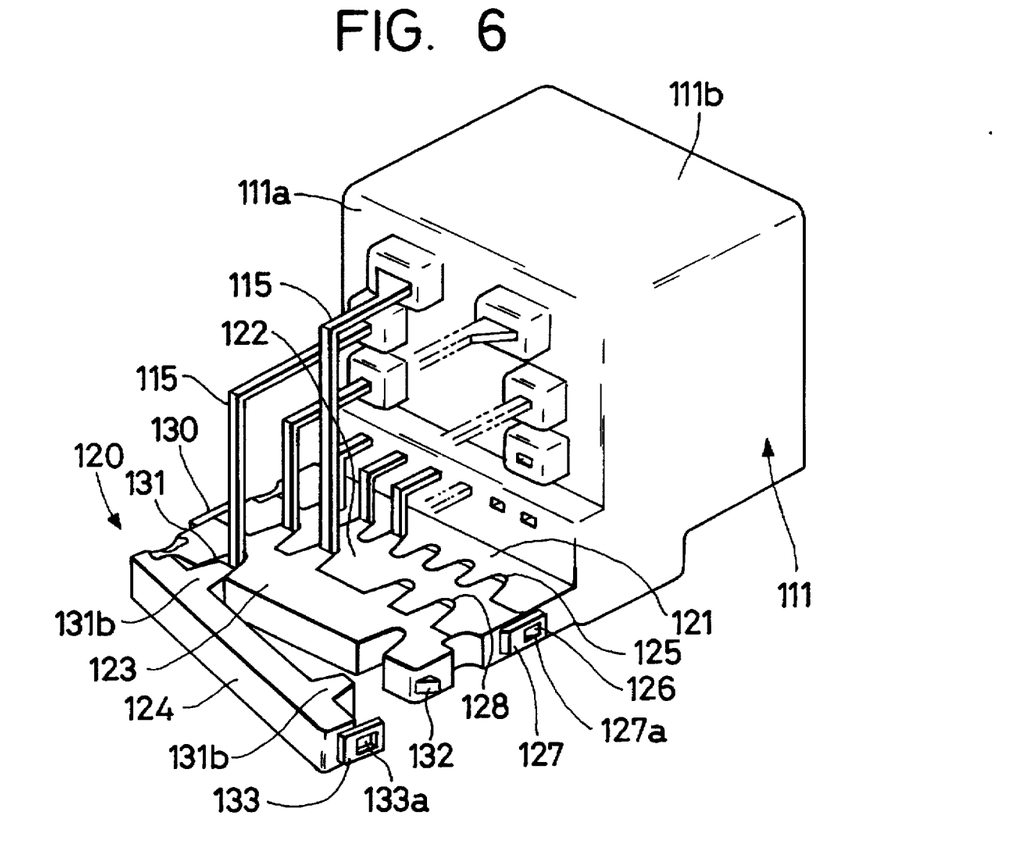
FIG. 6 is a perspective view of the connector according to the second embodiment of the invention.

An alignment plate 40 is connected to a lower face of the housing 20 via a sheet-shaped hinge portion 22. Since the hinge portion 22 is sheet-shaped, it is easily bent, so that the alignment plate 40 can be rotated backward (to the left in FIG. 2). When the alignment plate is rotated backward, it makes a right angle with the board terminals 32. As shown in FIG. 5, through-holes 41 are formed on alignment plate 40 at positions corresponding to normal positions of the board terminals 32. The inner circumference of each through-hole 41 is not straight-pipe-shaped, but is taper-shaped, the rear side of which expands, to the bottom as shown in FIG. 2 or on the left as shown in FIGS. 3–5.

Further, a guide rib 42 protrudes from an edge of the through-hole opening on the expanded side. The guide rib 42 extends along the inner circumference of the through-hole 41 on a side opposite to the hinge portion 22 and protrudes outside the through-hole such that it spreads out in a fan-shape.

The shape of the guide rib 42 is determined as follows. Because the board terminal 32 penetrates the alignment plate 40 in its final, aligning position, when the alignment plate 40 is rotated as shown in FIG. 3, an end of the board terminal 32 initially contacts the side opposite to the hinge portion 22 with respect to the center of the through-hole 41. Accordingly, when the alignment plate 40 is rotated through an arc into position, the expanded portion of the through-hole 41 can guide the end of the board terminal 32 into the through-hole 41. The original object of the alignment plate 40 is to prevent difficulty in the insertion of the board terminals 32 into the printed board in the case where the board terminals 32 deviate from the normal positions, that is, the original object of the alignment plate 40 is to align the board terminals 32 in their normal positions. Therefore, it is necessary to form the through-holes 41 into fan-shapes so that the ends of the board terminals located in the normal positions can be guided into the through-holes 41. Further, it is necessary to form the through-holes 41 into fan-shapes so that the expanded through-holes also guide board terminals 32 that deviate from the normal positions.

As far as the guide ribs 42 are concerned, any shapes may be adopted for the guide ribs 42 as long as guide ribs 42 are capable of guiding board terminals 32 that deviate within a range of deviation. In the first embodiment, the guide rib 42 is formed only on the side opposite to the hinge portion 22. However, for example, the guide rib 42 may protrude from the entire circumference of the opening of the through-hole 41. The fan-shape in which the guide rib spreads out may be an arc or a plurality of planes connected to each other.

On a bottom face of the housing 20, a groove 23 is formed that extends in the longitudinal direction on the rear side of the hinge portion 22. The alignment plate 40 has a narrow width portion 43 which engages with the groove 23 when the alignment plate 40 is rotated backward. Protrusions 24,24 which protrude downward are provided. Recesses 24a,24b are formed at the front and rear of both protrusions 24,24. On the alignment plate 40, to the front and the rear of the narrow width portion 43, protrusions 44,45 are formed at positions which face the recesses 24a,24b at the front and rear of the protrusions 24. The recess 24a is opposed to an engaging protrusion 44 which protrudes backward (to the left in FIG. 2) when the alignment plate 20 is rotated, and the recess 24b is opposed to a lock protrusion 45 which can be curved forward (to the right in FIG. 2) on both sides of the groove 23 when the alignment plate 20 is rotated. In the final, aligning position to which the alignment plate 40 is rotated, the engaging protrusion 44 engages with the recess 24a of the protrusion 24, and the lock protrusion 45 engages with the recess 24b of the protrusion 24.

The groove 23 is formed between the two protrusions 24,24 extending in the longitudinal direction, and the narrow width portion 43 of the alignment plate 40 is positioned in the groove 23, so that the engaging protrusion 44 engages with the front of the protrusion 24 such that the protrusion and recess are engaged with each other. The alignment plate 40 engages with the bottom face of the housing 20 in such a manner that it can be rotated at the fore end. This engagement stabilizes the rotational axis of the alignment plate 40. With regard to the lock protrusion 45, as long as the alignment plate 40 can be locked in the final, aligning position, locking may be accomplished at other positions. Further, locking may be accomplished stepwise at each position.

Operation of the first embodiment described above will be explained below.

When the alignment plate 40 starts rotating when the hinge portion 22 is bent, the engaging protrusion 44 is opposed to the front of the protrusion 24 and naturally enters the recess 24a. When the alignment plate 40 is rotated only by the hinge portion 22, the rotational axis tends to deviate, but, when the alignment plate 40 is rotated with the engaging protrusion 44 engaged with the recess 24a, the rotational axis is stabilized. Further, since the flexible lock protrusion 45 is located on the rear side, when the alignment plate 40 is rotated backwards, the lock protrusion 45 contacts a corner of the protrusion 24 on the rear side. Accordingly, the engaging protrusion 44 is drawn toward the rear side and engaged with the recess 24a, so that the rotational axis is further stabilized. When the lock protrusion 45 contacts the corner of the protrusion 24, the board terminals 32 arranged in a row close to the hinge portion 22 collide with the inner circumferential surfaces of the guide ribs 42 as shown in FIG. 3. Then the board terminals 32 are bent and guided toward the through-holes 41. When the alignment plate 40 is rotated further, the board terminals 32 gradually collide with the inner circumferential surfaces of the guide ribs 42 from board terminals 32 located close to the hinge portion 22 to board terminals 32 located distant from the hinge portion 22. Thus, the board terminals 32 are guided to the through-holes 41 as shown in FIGS. 4 and 5.

As described above, the alignment plate 40 is rotatably connected with the lower face of the housing 20 via the hinge portion 22, and the guide ribs 42 are formed at the openings of the through-holes 41 so that the ends of the board terminals 32 can be guided into the through-holes 41. Due to the above arrangement, when the alignment plate 40 is rotated to the rear side, all board terminals 32 are guided into the through-holes 41 by the guide ribs 42, so that the alignment plate 40 can be attached to the housing.

In the final, aligning position in which the alignment plate 40 is set in a substantially horizontal position as shown in FIG. 5, the board terminals 32 penetrate the through-holes 41 on the alignment plate 40 and are held at the normal positions. Since the lock protrusion 45 enters the recess 24b of the protrusion 24 on the rear side and locks the alignment plate 40 in place, the alignment plate 40 is fixed at a predetermined position. Since the alignment plate 40 is fixed, the connector does not wobble or deviate from position. Therefore, even when the connector is vibrated, noise is not generated. Also, the alignment plate 40 is not disengaged from the housing when the connector is moved about.

In the above embodiment, the lock protrusion 45 is engaged with the rear face of the protrusion 24 only in the final, aligning position of the alignment plate. However, the lock protrusion 45 may be engaged with the rear face of the protrusion 24 in an oblique position. For example, when the board terminals 32 located on the side opposite to the hinge portion 22 collide with the inner circumferential surfaces of the guide ribs 42, the board terminals 32 located close to the hinge portion 22 have already been guided into the through-holes 41. The alignment plate 40 may be temporarily locked at the above position. When the alignment plate 40 is rotated to the final, aligning position, ends of the board terminals 32 protrude considerably from the alignment plate. Therefore, when the connector is moved about, ends of the board terminals 32 collide with foreign bodies possibly breaking or damaging the board terminals 32. However, when the alignment plate 40 is temporarily fixed before reaching the final, aligning position as described above, ends of the board terminals 32 do not protrude considerably from the alignment plate 40, so that damage of the board terminals 32 can be prevented. It is preferable that the board terminals 32, arranged close to the hinge portion 22, are located in the through-holes 41 when the board terminals 32, arranged on the opposite side to the hinge portion 22, collide with the inner circumferential surfaces of the guide ribs 42. However, when the board terminals 32 slightly protrude as shown in FIG. 4, even if the board terminals 32 collide with foreign bodies, they are seldom broken and the same effect is provided. When it is not necessary that the lengths of the board terminals 32 be the same, the board terminals 32 located distant from the hinge portion 22 are made longer in accordance with the inclination angle of the alignment plate 40. Due to the above arrangement, it is possible to temporarily fix the alignment plate 40 while the ends of all board terminals 32 are held in the through-holes 41.

Referring to FIGS. 6 to 12, the second embodiment of the invention will be explained as follows.

Reference numeral 111 is a connector housing, which is made of insulating synthetic resin formed into a box-shape with one face (the right face shown in FIG. 7) which is open. The inside of the connector housing 111 is formed as an engagement chamber 112 with which an opponent female connector not shown is engaged. The most inner part of the engagement chamber 112 is formed as a back wall portion 111a. A plurality of terminal press-fit holes 114 are provided in the back wall portion 111a and the upper face wall 111b such that they penetrate the back wall portion 111a and the upper face wall 111b in the transverse direction. In this embodiment, for example, 4 rows of terminal press-fit holes 114 are formed. A plurality of terminals 115 comprising slender metallic rods are press-fitted into the terminal press-fit holes 114. The terminals 115 in the uppermost row are located in the upper face wall 111b. Right half portions of the 3 rows of residual terminals 115, which penetrate the back wall portion 111a, straightly extend into the engagement chamber 112. The terminal press-fit holes 114 are previously formed during forming of the connector housing 111. To press-fit the terminals 115 into the terminal press-fit holes 114 so as to fix the terminals 115, diameters of the terminal press-fit holes 114 are structured to be slightly smaller than the outer diameters of the terminals 115.

Figure 7:
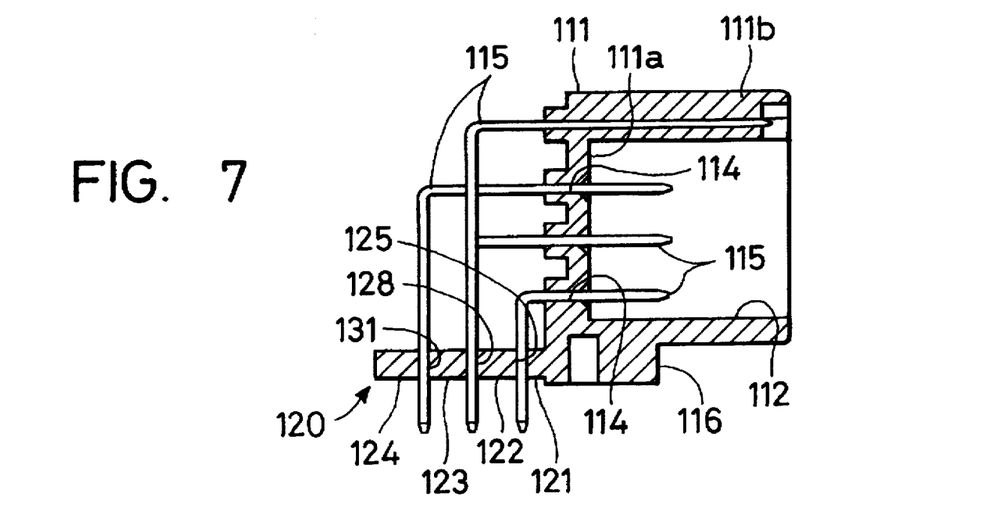
FIG. 7 is a longitudinal cross-sectional view of the connector.

As shown in FIG. 7, portions of the terminals 115 protruding from the back wall portion 111a and the upper wall 111b to the left are bent downward at right angles, so that ends of the terminals 115 are directed in a direction perpendicular to the lower face of the connector housing 111. Although not shown in the drawings, a lower face of the connector housing 111 is fixed onto the printed circuit board via a mount portion 116 by means of screws. Lower end portions of the terminals 115 penetrate the land holes on the printed circuit board and are soldered onto the printed circuit board.

Figures 8, 9:
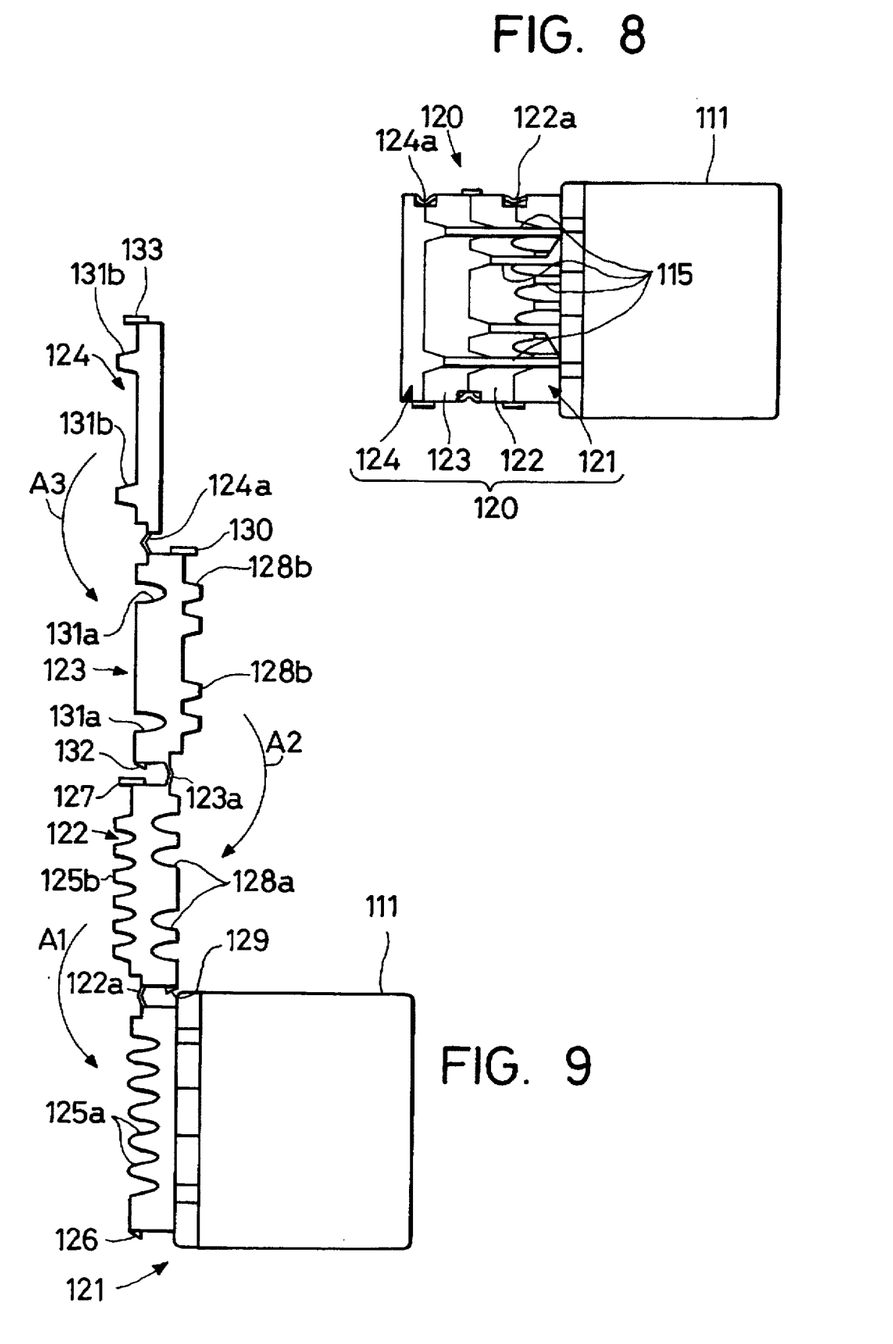
FIG. 8 is a plan view of the connector.
FIG. 9 is a plan view showing a condition in which the division elements are separate from each other.
Figure 10:
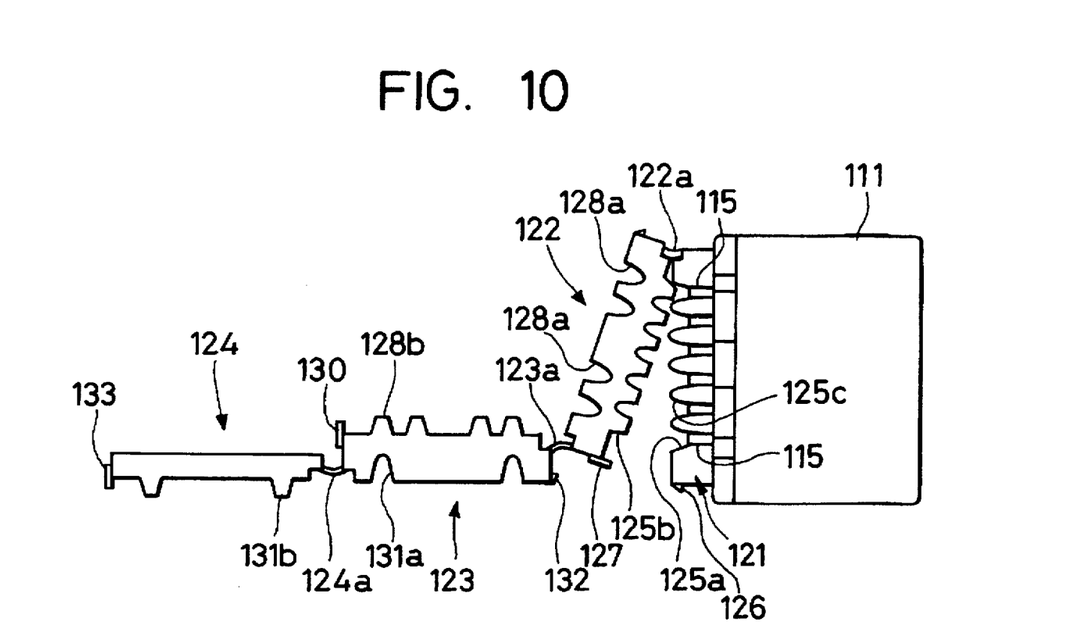
FIG. 10 is a plan view showing the assembly process.

At a lower portion of the back wall portion 111a of the connector housing 111, a terminal alignment member 120 made of synthetic resin is provided. The terminal alignment member 120 is a plate-shaped member arranged along the lower face of the connector housing 111. As shown in FIG. 9, the terminal alignment member 120 includes a first division element 121 formed integrally with the connector housing 111; a second division element 122 attachable to the face of the first division element 121 when the face of the second division element 122 is butted thereto; a third division element 123 attachable to the face of second division element 122 when the face of the third division element 123 is butted thereto; and a fourth division element 124 attachable to the face of the third division element 123 when the face of the fourth division element 124 is butted thereto.

As described above, the first division element 121 is plate-shaped and formed integrally with the connector housing 111 such that the first division element 121 protrudes backward (to the left in FIG. 6) from the lower portion of the back wall portion 111a of the connector housing 111. The first division element 121 is located at a position slightly above the bottom face of the mounting base portion 116. The first division element 121 on its end face, has V-shaped cutout portions 125a, the ends of which extend to the left in FIG. 6, corresponding to the 6 terminals in the lowermost row, and a lock claw 126 that protrudes from one side end (the lower side end shown in FIG. 9).

The second division element 122 is structured so that it can be butted to and connected with the end face of the first division element 121. One end (the lower end in FIG. 9) of the second division element 122 is connected with the upper end of the first division element 121 via a hinge portion 122a. When the second division element 122 is rotated in the direction of arrow A1 in FIG. 9 around the hinge portion 122a, the second division element 122 can be butted to the first division element 121. On the end face of the second division element 122 which is butted to the first division element 121, six tapering protrusions 125b are provided, which are formed in the shape of a trapezoid, corresponding to the aforementioned V-shaped cutout portions 125a of the first division element 121. When the second division element 122 is rotated and butted to the first division element 121, the tapering protrusions 125b of the second division element 122 enter the V-shaped cutout portions 125a of the first division element 121. Since ends of the tapering protrusions 125b are relatively short, terminal through-holes 125 are formed between the tapering protrusions 125b and the V-shaped cutout portions 125a (shown in FIG. 6). On the side of the second division element 122 opposite to the hinge portion 122a, an engaging portion 127 is provided which protrudes toward the first division element 121. When the second division element 122 is butted to the first division element 121, an engaging hole 127a of the engaging portion 127 is engaged with the lock claw 126 of the first division element 121 so that they are connected to each other.

Further, on an end face of the second division element 122 opposite to the tapering protrusions 125b, four V-shaped cutout portions 128a are provided corresponding to the two terminals 115 in the second row and the two terminals 115 in the uppermost row, that is, corresponding to four terminals 115 in total. At the lower end of the second division element 122, a lock claw 129 is provided which protrudes to the side.

The third division element 123 is shaped to be butted to and connected with the end face of the second division element 122. A lower end of the third division element 123 is connected with an upper end of the second division element 122 via a hinge portion 123a. When the third division element 123 is rotated in the direction of arrow A2 in FIG. 9 around the hinge portion 123a, the third division element 123 can be butted to the second division element 122. On an end face of the third division element 123 which is butted to the second division element 122, four trapezoidal plate-shaped tapering protrusions 128b are provided corresponding to the V-shaped cutout portions 128a. When the third division element 123 is rotated and butted to the second division element 122, the tapering protrusions 128b enter the V-shaped cutout portions 128a of the second division element 122. Since the tapering protrusions 128b are relatively short at the ends, terminal through-holes 128 are formed between the tapering protrusions 128b and the V-shaped cutout portions 128a (shown in FIG. 6). On the side of the third division element 123 opposite to the hinge portion 123a, an engaging portion 130 is provided which protrudes toward the second division element 122. When the third division element 123 is butted to the second division element 122, an engaging hole of the engaging portion 130 engages with the lock claw 129 of the second division element 122 so that they are connected to each other.

Further, on an end face of the third division element 123 opposite to the tapering protrusions 128b, two V-shaped cutout portions 131a are provided corresponding to the two terminals 115 in the third row. At the lower end of the third division element 123, a lock claw 132 is located which protrudes to the side.

The fourth division element 124 is shaped to be butted to and connected with the end face of the third division element 123. A lower end of the fourth division element 124 is connected with an upper end of the third division element 123 via a hinge portion 124a. When the fourth division element 124 is rotated in the direction of arrow A3 in FIG. 9 around the hinge portion 124a, the fourth division element 124 can be butted to the third division element 123. The hinge portions 122a to 124a are formed in a C-shape and bent toward the center of the division elements 122 to 124, so that they do not protrude beyond the side ends of the division elements 122 to 124. On an end face of the fourth division element 124 which is butted to the third division element 123, two trapezoidal plate-shaped tapering protrusions 131b are provided corresponding to the V-shaped cutout portions 131a. When the fourth division element 124 is rotated and butted to the third division element 123, the tapering protrusions 131b enter the V-shaped cutout portions 131a of the third division element 123. Since the tapering protrusions 131b are relatively short at the ends, terminal through-holes 131 are formed between the tapering protrusions 131b and the V-shaped cutout portions 131a (shown in FIG. 6). On the opposite side of the fourth division element 124 to the hinge portion 124a, an engaging portion 133 is located which protrudes toward the third division element 123. When the fourth division element 124 is butted to the third division element 123, an engaging hole 133a of the engaging portion 133 engages with the lock claw 132 of the third division element 123 so that they are connected to each other.

Since the first to the fourth division elements 121 to 124 are formed integrally with the connector housing 111, they are connected to each other in series via the hinge portions 122a to 124a.

Next, the manufacturing procedure of the connector of the above arrangement will be explained below.

First, the terminals 115 are press-fitted into the lowermost row of terminal press-fit holes 114 to a predetermined depth, and intermediate portions of the terminals 115 are bent so that the end portions are directed downward. At this time, lower portions of the bent terminals 115 are inserted in the V-shaped cutout portions 125a of the first division element 121 which protrude from the back wall portion 113 (shown in FIG. 10).

Next, the second division element 122 is rotated around the hinge portion 122a. The tapering protrusions 125b of the second division element 122 push the terminals 115 into the inner portions of the V-shaped cutout portions 125a of the first division element 121. When the engaging portion 127 engages with the lock claw 126, the V-shaped cutout portions 125a are closed by the tapering protrusions 125b while the terminal through-holes 125 are left in the V-shaped cutout portions 125a. Accordingly, the terminals 115 penetrate the terminal through-holes 125.

Figure 11:
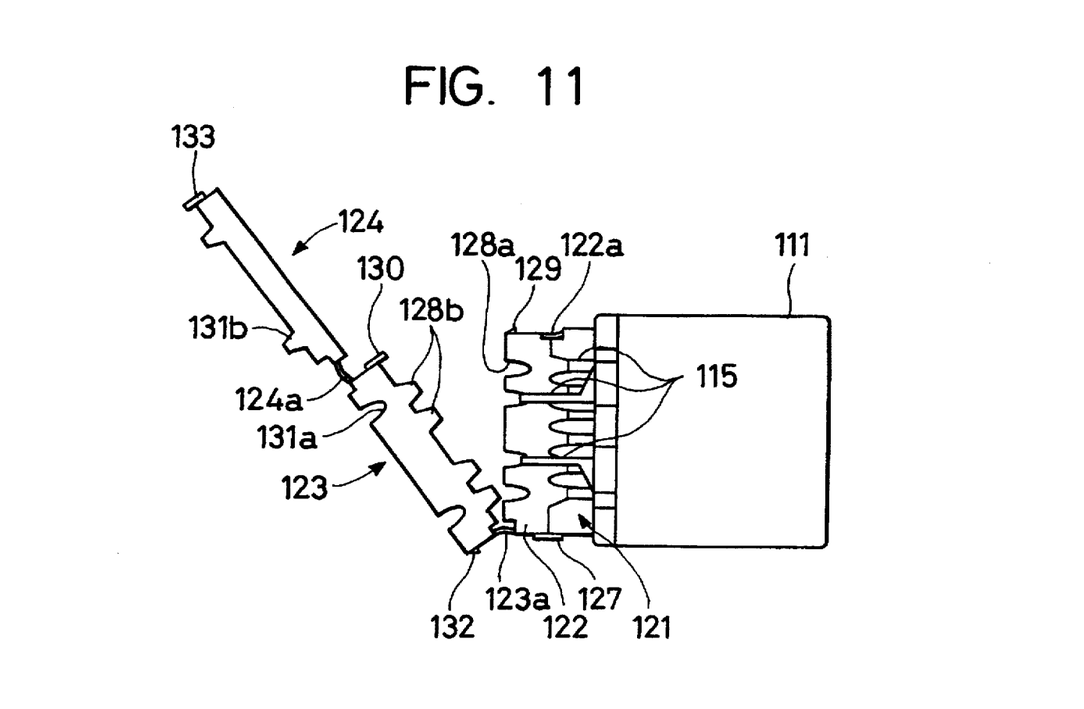
FIG. 11 is a plan view showing the assembly process.

Next, the upper row of terminals 115 are press-fitted into the terminal press-fit holes 114, and predetermined portions of the terminals 115 are bent (shown in FIG. 11). Also, the uppermost row of terminals 115 are press-fitted into the terminal press-fit holes 114 in the upper face wall 111b of the connector housing 111, and predetermined portions of the terminals 115 are bent. Then, lower portions of the bent terminals 115 are accommodated in the V-shaped cutout portions 128a of the second division element 122 and in the same manner as that of the second division element 122, the third division element 123 is rotated around the hinge portion 123a. As a result, the tapering protrusions 128b of the third division element 123 push the terminals 115 into the inner portions of the V-shaped cutout portions 128a of the second division element 122. When the engaging portion 130 engages with the lock claw 129, the V-shaped cutout portions 128a are closed by the tapering protrusions 128b while the terminal through-holes 128 are left in the V-shaped cutout portions 128a with the terminals 115 penetrating the terminal through-holes 128.

Finally, the fourth division element 124 is rotated around the hinge portion 124a to be butted on the end face of the third division element 123, and the engaging portion 133 engages with the lock claw 132. Accordingly, the V-shaped cutout portions 131a of the third division element 122 are closed by the tapering protrusions 131b while the terminal through-holes 131 are left in the V-shaped cutout portions 131a with the terminals 115 penetrating the terminal through-holes 131 (shown in FIGS. 6 and 12).

Ends of the terminals 115 of the thus completed connector are inserted into the land holes formed on the printed circuit board (not shown) and fixed onto the printed circuit board by means of screws, and the terminals 115 are soldered to the peripheries of the land holes.

According to the connector of this embodiment, ends of the group of terminals 15 penetrate the terminal through holes 125, 128, 131 of the terminal alignment member 120. Therefore, the group of terminals 115 can be maintained in a complete alignment by the terminal alignment member 120 at all times. As a result, it is possible to prevent the group of terminals 115 from colliding with other objects when the connector is moved about or in the middle of various work, so that it is possible to avoid misalignment of the group of terminals 115. As a result, the connector can be quickly mounted on the printed circuit board.

According to the manufacturing method and the connector described above, to make the group of terminals 115 penetrate the terminal through-holes 125, 128, 131 of the terminal alignment member 120, it is sufficient that the second to the fourth division elements 122 to 124 are butted to each other such that the terminals 115 are interposed between the division elements. Therefore, it is not necessary for a large number of terminals to be simultaneously inserted into small holes. Further, since the division elements 121 to 124 are connected with each other via the hinge portions 122a to 124a, they may be handled as one piece together with the connector housing. Therefore, the number of parts is reduced. To make the division elements butt to each other, it is only necessary to rotate the division elements around the hinge portions 122a to 124a and fold them successively. Therefore, it is possible to apply this arrangement to automation, and productivity can be remarkably enhanced. Further, when the engaging portions 127, 130, 133 are engaged with the lock claws 126, 129, 132, the division elements 122 to 124 are attached to each other. Therefore, attachment can be easily accomplished in a short period of time, and automation can be easily accomplished.

Further, the V-shaped cutout portions 125a, 128a, 131a are formed in the division elements 121 to 123, and the tapering protrusions 125b, 128b, 131b are inserted into the V-shaped cutout portions 125a, 128a, 131a. Even if a phenomenon of spring-back is caused after the terminals have been bent and the terminals are displaced from the V-shaped cutout portions, the terminals are positively pushed into the V-shaped cutout portions and penetrated through the terminal through-holes 125, 128, 131.

Figures 12, 13:
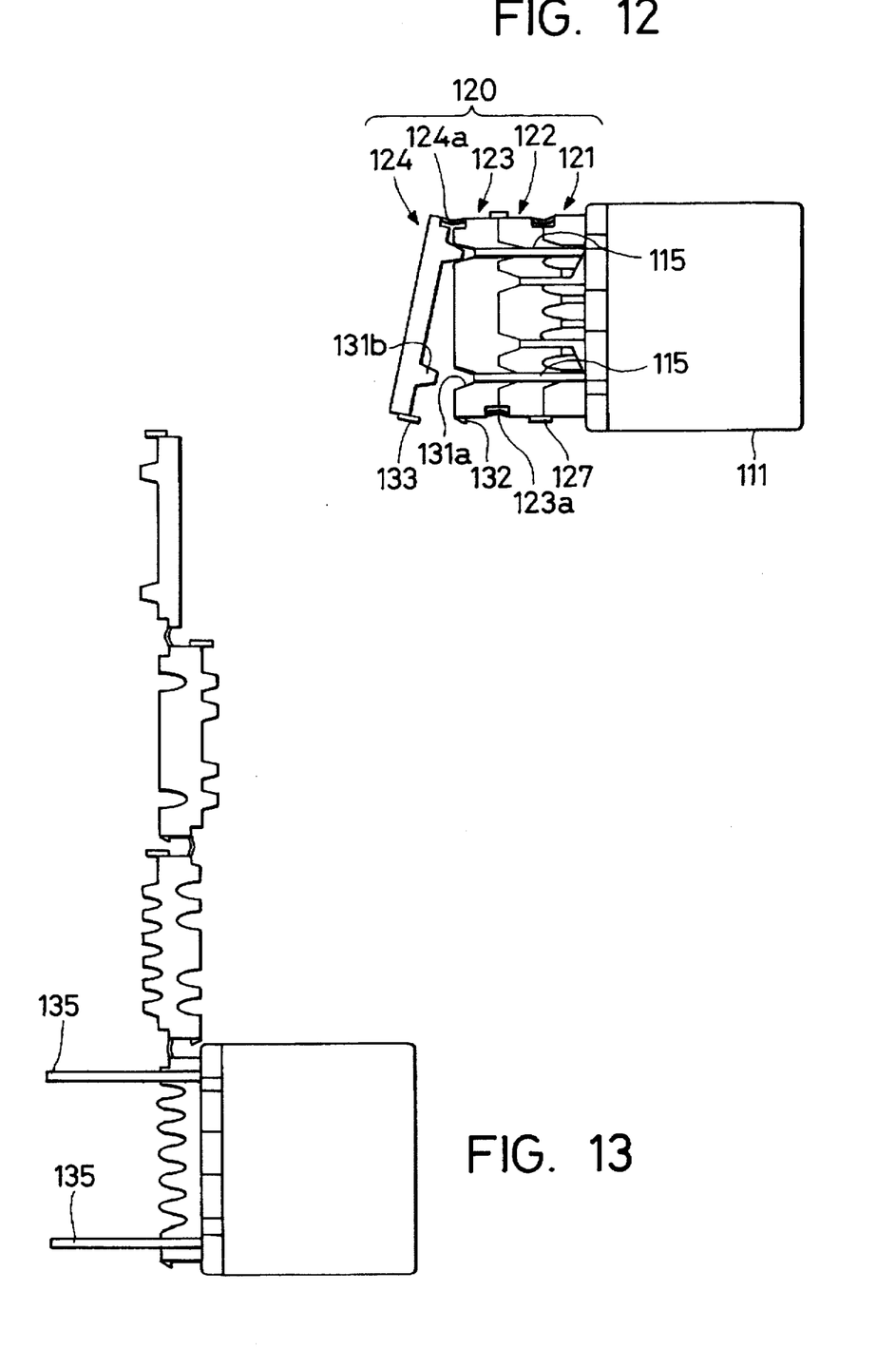
FIG. 12 is a plan view showing the assembly process.
FIG. 13 is a plan view of the connector according to the third embodiment of the invention showing a condition in which the division elements are separate from each other.
Figure 14:
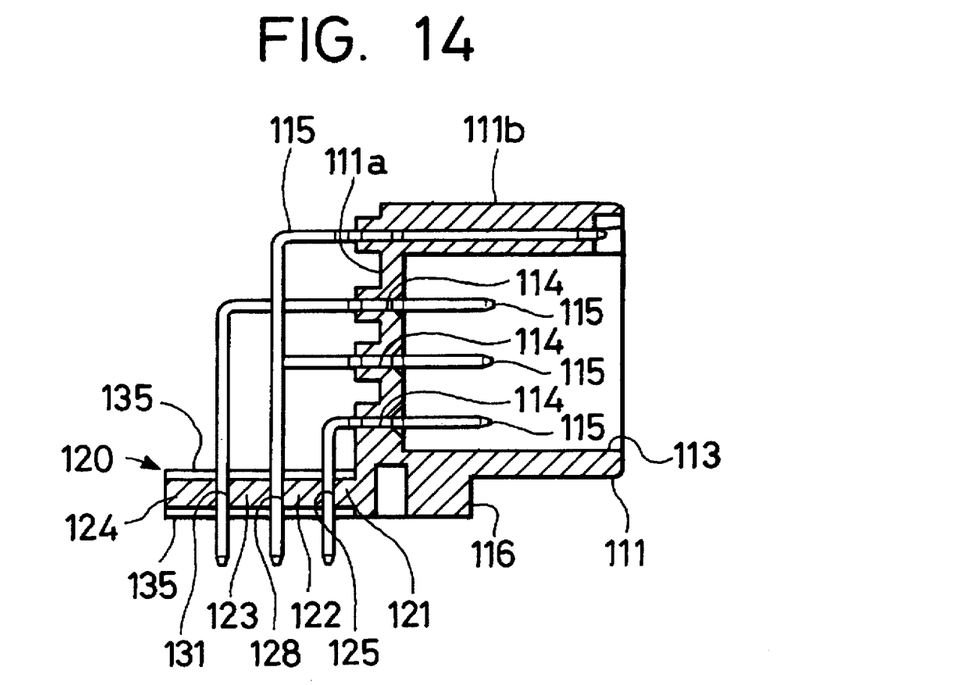
FIG. 14 is a longitudinal cross-sectional view of the connector.
Figure 15:
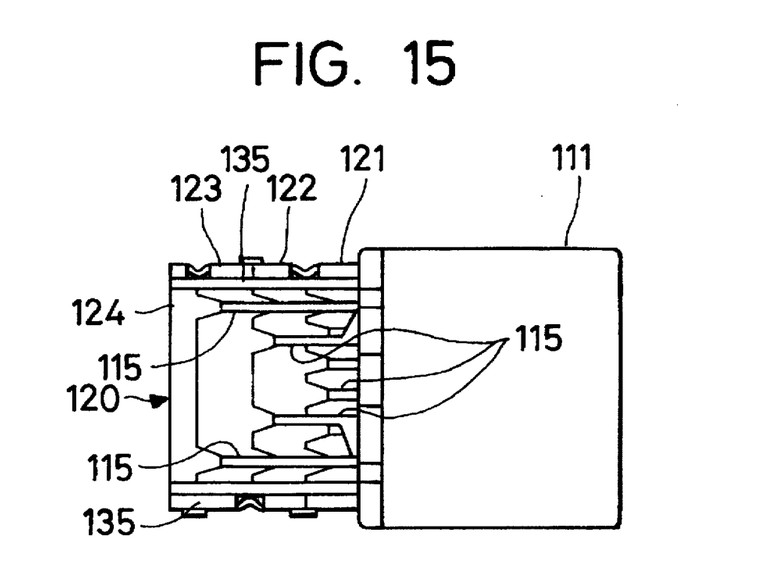
FIG. 15 is a plan view of the connector.

FIGS. 13 to 15 are views showing the third embodiment of the invention. The difference between the third embodiment, and the second embodiment and the first embodiment described before is that guide ribs 135 are provided which protrude backward (to the left in FIG. 13) from the back wall 111a of the connector housing 111. There are four guide ribs 135 two of which are shown in FIG. 13. The guide ribs are arranged on both sides of the back wall 111a, as shown in FIG. 13, and as shown in FIG. 14, pairs of guide ribs are arranged so that the division elements 121 to 124 are interposed between the guide ribs. The third embodiment is the same as the second embodiment except for the guide ribs 135 protruding from the back wall 111a.

When the guide ribs 135 are arranged to protrude from the back wall as described above, the following advantages are provided. When the division elements 122 to 124 are rotated around the hinge portion 122a to 124a, they enter a clearance formed between the upper and lower guide ribs 135, so that the division elements 122 to 124 are guided by the guide ribs 135. Therefore, the division elements 122 to 124 are not displaceable in the upward and downward directions, that is, they are smoothly arranged in order. In this way, the terminal alignment member 120 is simplified.

It should be noted that the invention is not limited to the specific embodiments explained above with reference to the accompanying drawings. For example, the following embodiments are included in the scope of claims of the invention.

According to the embodiments described above, the terminal alignment member 120 is composed of four division elements including the first to the fourth division elements 121 to 124. However, when only one row of terminals 115 protrude from the connector housing ill, the terminal alignment member can be composed of two division elements. Where the number of rows is not less than four, the number of division elements may be increased in accordance with the number of the rows.

Variations may be made by one skilled in the art without departing from the scope of the invention, for example, the terminals are not necessarily bent.

As explained above, according to the invention, the alignment plate is fixed to the housing via the hinge. Therefore, it is possible to easily attach the alignment plate when the hinge is bent without taking great care in the positioning of the alignment plate. When the guide ribs are provided at the through-holes, the board terminals can be easily inserted into the through-holes in accordance with the rotation of the alignment plate.

Further, while the hinge is formed, the rotational fulcrum is accurately determined by the action of the protrusion and recess engaging mechanism. Accordingly, the board terminals can be easily inserted.

Furthermore, since the housing and the alignment plate are locked to each other at the final, aligning position, noise is seldom generated even if the connector is vibrated. Therefore, the alignment plate does not disengage when the housing of the connector is moved about.

Still further, it is possible to prevent the ends of board terminals from being bent and broken when the connector is moved about.

Moreover, it is not necessary to insert the terminals into small holes, and it is sufficient only to butt the division elements to each other. Therefore, the group of terminals of the connector can be very simply inserted into the terminal through-holes of the terminal alignment member. Consequently, the productivity can be greatly enhanced and the cost can be reduced. Further, the division elements are connected to each other by the hinge portions so they can be handled as one piece. Accordingly, parts control is simplified. When the division elements are attached to each other by folding them at the hinge portions, they are butted to each other. Therefore, this arrangement can be easily adopted to automation, and productivity can be further enhanced.

In addition to the above, since the terminals are pushed into the V-shaped cutout portions when the division elements are folded to each other, even when the terminals slightly deviate from the normal positions in the transverse direction, they can be naturally guided to their normal positions. Accordingly, automation is easy to accomplish.

In addition to the above, since the division elements are guided by the guide ribs, the division elements can be more easily combined with each other. Since the division elements are engaged with each other by the engaging portions when they are combined, the combined condition can be positively maintained.

I claim:

1. A connector comprising:

a plurality of terminals protruding from a face of a connector housing; and a terminal alignment member having terminal through-holes though which the plurality of terminals penetrate, the terminal alignment member being attached to the connector housing and including a plurality of division elements that butt to each other to form the plurality of terminal through-holes in a final, aligning position, wherein the plurality of division elements are connected to each other by hinge portions.

2. The connector of claim 1, wherein the terminal through-holes are formed between V-shaped cutout portions provided in one of the division elements butted to each other and tapering protrusions provided in the other of the division elements when the tapering protrusions enter the V-shaped cutout portions.

3. The connector of claim 2, wherein the connector housing further comprises at least one guide rib for contacting and guiding the terminal alignment member into the final, aligning position.

4. The connector of claim 1, wherein the connector housing includes at least one guide rib for contacting and guiding the terminal alignment member into the final, aligning position.

5. The connector of claim 1, further comprising engaging mechanisms for locking abutting division elements to each other.

6. A connector to be mounted on a board, the connector comprising:
a housing having a plurality of board terminals that protrude from a back face of the housing and are bent toward a plane defined by a bottom face of the housing; and
an alignment plate having through-holes formed at positions corresponding to normal positions of the plurality of board terminals, the alignment plate being attached to a bottom face of the housing via a hinge portion, wherein the alignment plate can be rotated around the hinge portion while a rear end of the alignment plate is directed to ends of the board terminal and wherein through-hole guide ribs are provided at the through-holes formed on the alignment plate such that a circumferential surface of each guide rib on a side opposite to the hinge portion spreads out in a fan-shape.

7. The connector of claim 6, wherein the alignment plate and the housing are provided with a protrusion and recess engaging mechanism which functions as a rotational fulcrum.

8. A connector to be mounted on a board, the connector comprising:
a housing having a plurality of terminal fittings to be connected with an opponent connector and also provided with board terminals communicating with the terminal fittings that protrude from a back face of the housing and are bent toward a plane defined by a bottom face of the housing; and
an alignment plate connected with the bottom face of the housing via a hinge portion, wherein the alignment plate includes through-holes formed at positions corresponding to normal positions of the plurality of board terminals when the alignment plate is rotated toward the back face of the housing to a final, aligning position, and wherein through-hole guide ribs are provided at the through-holes such that a circumferential surface of each guide rib on a side opposite to the hinge portion spreads out in a fan-shape.

9. The connector of claim 8, wherein the alignment plate and the housing are provided with a protrusion and recess engaging mechanism which functions as a rotational fulcrum.

10. The connector of claim 9, wherein the alignment plate and the housing are provided with a lock mechanism by means of which the alignment plate and the housing are fixed in the final, aligning position in which the alignment plate is substantially completely rotated backward.

11. The connector of claim 9, further comprising a conveyance lock mechanism by which the alignment plate is fixed relative to the housing in a position wherein fore ends of approximately all the plurality of board terminals are located within a range of thickness of the alignment plate before the alignment plate has reached the final, aligning position.

12. A connector comprising:
a plurality of terminals protruding from a side surface of a connector housing; and
a terminal alignment member at least a portion of which is rotatably attached to a bottom portion of the connector housing, the terminal alignment member having terminal through-holes though which the terminals penetrate for maintaining the terminals in normal positions when the terminal alignment member is rotated to a final, aligning position.

13. The connector of claim 12, wherein the terminal alignment member comprises a plurality of division elements that butt to each other to form the plurality of terminal through-holes and wherein a first of the plurality of division elements is integral with and is an extension of the bottom portion of the housing and the plurality of division elements are connected to each other by hinge portions.

14. The connector of claim 13, wherein the terminal through-holes are formed between V-shaped cutout portions provided in one of the division elements butted to each other and tapering protrusions provided in the other of the division elements butted to each other when the tapering protrusions enter the V-shaped cutout portions.

15. The connector of claim 13, wherein the connector housing further comprises at least one guide rib for contacting and guiding the terminal alignment member into the final, aligning position.

16. The connector of claim 12, wherein the alignment plate is attached to the bottom portion of the housing via a hinge portion such that the alignment plate can be rotated around the hinge portion while a rear end of the alignment plate is directed to ends of the board terminal and wherein through-hole guide ribs are provided at the through-holes formed on the alignment plate such that a circumferential surface of each guide rib on a side opposite to the hinge portion spreads out in a fan-shape.

17. The connector of claim 16, wherein the alignment plate and the housing are provided with a protrusion and recess engaging mechanism which functions as a rotational fulcrum.

18. The connector of claim 17, wherein the alignment plate and the housing are provided with a lock mechanism by means of which the alignment plate and the housing are fixed in the final, aligning position in which the alignment plate is substantially completely rotated backward.

19. The connector of claim 18, further comprising a conveyance lock mechanism by which the alignment plate is fixed relative to the housing in a position wherein fore ends of approximately all the plurality of board terminals are located within a range of thickness of the alignment plate before the alignment plate has reached the final, aligning position.

20. A connector comprising:
a plurality of terminals means for connecting to a printed circuit board, the plurality of terminal means protruding from a side surface of a connector housing; and
a terminal alignment means for maintaining the terminals in normal positions when the terminal alignment member is rotated to a final, aligning position, the terminal alignment means being rotatably attached to a bottom portion of the connector housing and having terminal through-holes though which the terminals penetrate.

* * * * *